United States Patent
Chandrasekaran et al.

(10) Patent No.: US 8,482,125 B2
(45) Date of Patent: Jul. 9, 2013

(54) CONDUCTIVE SIDEWALL FOR MICROBUMPS

(75) Inventors: Arvind Chandrasekaran, San Diego, CA (US); Shiqun Gu, San Diego, CA (US); Christine S. Hau-Riege, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 150 days.

(21) Appl. No.: 12/837,717

(22) Filed: Jul. 16, 2010

(65) Prior Publication Data

US 2012/0012998 A1 Jan. 19, 2012

(51) Int. Cl.
*H01L 23/488* (2006.01)

(52) U.S. Cl.
USPC ............ 257/748; 257/752; 257/E23.021; 257/E23.027

(58) Field of Classification Search
USPC ............... 257/738, 748, E23.021, E23.027, 257/752
See application file for complete search history.

(56) References Cited

U.S. PATENT DOCUMENTS

| | | | |
|---|---|---|---|
| 5,644,586 A * | 7/1997 | Kawano et al. | 372/44.01 |
| 6,043,429 A | 3/2000 | Blish, II et al. | |
| 6,224,690 B1 | 5/2001 | Andricacos et al. | |
| 6,534,863 B2 * | 3/2003 | Walker et al. | 257/737 |
| 6,884,313 B2 * | 4/2005 | Liu et al. | 156/292 |
| 7,112,522 B1 | 9/2006 | Tsao et al. | |
| 7,375,021 B2 | 5/2008 | Edelstein et al. | |
| 7,449,785 B2 | 11/2008 | Jeng et al. | |
| 2006/0292849 A1 | 12/2006 | Mueller et al. | |
| 2007/0108619 A1 * | 5/2007 | Hsu | 257/762 |
| 2007/0232051 A1 | 10/2007 | Wang et al. | |
| 2009/0149016 A1 | 6/2009 | Park et al. | |
| 2010/0140760 A1 | 6/2010 | Tam et al. | |
| 2011/0039370 A1 * | 2/2011 | Gomyo et al. | 438/109 |
| 2011/0101518 A1 * | 5/2011 | Cho et al. | 257/737 |

FOREIGN PATENT DOCUMENTS

| | | |
|---|---|---|
| EP | 0586243 A1 | 3/1994 |
| EP | 0586243 A1 | 3/1994 |
| EP | 2075834 A1 | 7/2009 |
| JP | 9181125 A | 7/1997 |
| JP | 9181125 A | 7/1997 |
| JP | 2006294761 A | 10/2006 |
| JP | 2006294761 A | 10/2006 |
| WO | 0055912 A1 | 9/2000 |
| WO | WO0055912 A1 | 9/2000 |
| WO | WO03098688 A2 | 11/2003 |

(Continued)

OTHER PUBLICATIONS

International Search Report and Written Opinion—PCT/US2011/043987—ISA/EPO—May 10, 2012.

(Continued)

*Primary Examiner* — George Fourson, III
(74) *Attorney, Agent, or Firm* — Michelle Gallardo (57) ABSTRACT

Electromigration in microbump connections causes voids in the microbumps, which reduces the lifetime of an integrated circuit containing the microbump. Electromigration lifetime may be increased in microbumps by forming a copper shell around the solder. The copper shell of one microbump contacts the copper shell of a second microbump to enclose the solder of the microbump connection. The copper shell allows higher current densities through the microbump. Thus, smaller microbumps may be manufactured on a smaller pitch without suffering failure from electromigration. Additionally, the copper shell reduces shorting or bridging between microbump connections on a substrate.

6 Claims, 13 Drawing Sheets

FOREIGN PATENT DOCUMENTS

| WO | 2005093816 A1 | 10/2005 |
| WO | WO2005093816 A1 | 10/2005 |
| WO | WO2011149567 A1 | 12/2011 |

OTHER PUBLICATIONS

International Search Report and Written Opinion—PCT/US2011/043987—ISA/EPO—Aug. 16, 2012.

Yu, A. et al., "Study of 15um Pitch Solder Microbumps for 3D IC Integration", 59th Electronic Components and Technology Conference (ECTC 2009), May 26, 2009, pp. 6-10, IEEE, Piscataway, NJ, USA, XP031474890, ISBN: 978-1-4244-4476-2.

Yu A., et al., "Study of 15um Pitch Solder Microbumps for 3D IC Integration", 59th Electronic Components and Technology Conference (ECTC 2009), May 26, 2009, pp. 6-10, IEEE, Piscataway, NJ, USA, XP031474890, ISBN: 978-1-4244-4476-2.

* cited by examiner (PRIOR ART)
FIG. 1

CONDUCTIVE SIDEWALL FOR MICROBUMPS

TECHNICAL FIELD

The present disclosure generally relates to integrated circuits. More specifically, the present disclosure relates to packaging integrated circuits.

BACKGROUND

Microbumps are small diameter solder connections between a first die and a second die or between a die and a packaging substrate. The small diameter of the microbumps allows high density connections to the die, however, the high density may result in shorting or bridging between connections.

Figure 1:
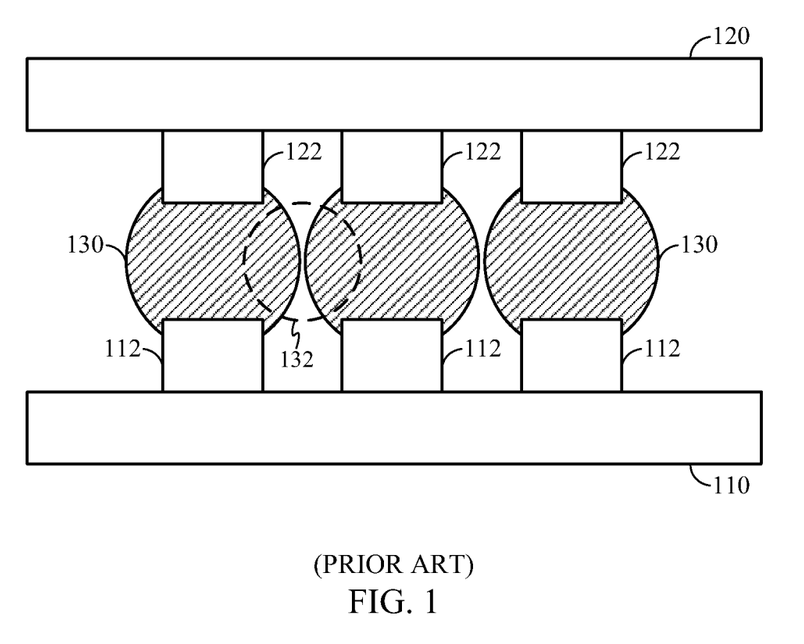
FIG. 1 is a cross-sectional view of two substrates connected through conventional microbumps.

FIG. 1 is a cross-sectional view of two substrates connected through conventional microbumps. A first substrate 110 having copper pillars 112 faces a second substrate 120 having copper pillars 122. A solder 130 connects pillars of the copper pillars 112 with pillars of the copper pillars 122. The combination of the copper pillars 122 and the solder 130 is a microbump. When the pitch between the copper pillars 112, 122 is too small, bridging or shorting may occur such as, for example, in a region 132.

The small diameter of microbumps also increases the current density through the microbumps. Increases in current density cause electromigration in the microbumps. Electromigration is the movement of metal atoms resulting from momentum transfer by electrons to the metal atoms. Electromigration causes voids in the microbumps, which reduces reliability of the connections and leads to failure of integrated circuits containing the microbumps.

Microbumps are conventionally made from solder materials such as tin and silver, which suffer from electromigration. Copper reduces electromigration effects, but is too rigid for reliable assembly or operation in integrated circuits.

Thus, there is a need for a microbump structure with improved electromigration performance.

BRIEF SUMMARY

According to one embodiment, a method includes forming an opening in a sacrificial layer on a contact pad of a substrate. The method also includes depositing a first conductive layer covering sidewalls of the opening and the bottom of the opening. The method further includes depositing a second conductive layer inside the first conductive layer, the second conductive layer having a lower melting point than the first conductive layer.

According to another embodiment, a method includes selecting a first substrate with microbumps having a first conductive material and a second conductive material substantially contained within the first conductive material. The method also includes selecting a second substrate with microbumps having a first conductive material and a second conductive material substantially contained within the first conductive material. The method further includes aligning microbumps of the first substrate with microbumps of the second substrate. The method also includes forming a bond between microbumps of the first substrate and microbumps of the second substrate such that the second conductive material is substantially contained inside the first conductive material and the first conductive material of the microbumps of the first substrate contacts with the first conductive material of the microbumps of the second substrate.

According to yet another embodiment, an apparatus includes a first substrate coupled to a second substrate. The apparatus also includes a packaging connection coupling the first substrate to the second substrate. The packaging connection has a shell of first conductive material around a second conductive material. The first conductive material has a higher melting point than the second conductive material.

According to a further embodiment, an apparatus includes an outer shell connecting means for reducing electromigration. The outer shell connecting means communicates with a first substrate and is capable of connecting with an outer shell connecting means of a second substrate. The apparatus also includes a solder connecting means of the first substrate for connecting with a solder connecting means of the second substrate. The solder connecting means of the first substrate resides within the outer shell connecting means of the first substrate.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

According to one embodiment, a copper sidewall is constructed around a solder microbump to improve reliability of the microbump connections. The solder provides flexibility during assembly, and the copper reduces electromigration. Additionally, a copper sidewall prevents lateral migration of the solder, reducing bridges and shorts between microbumps.

Figure 2A:
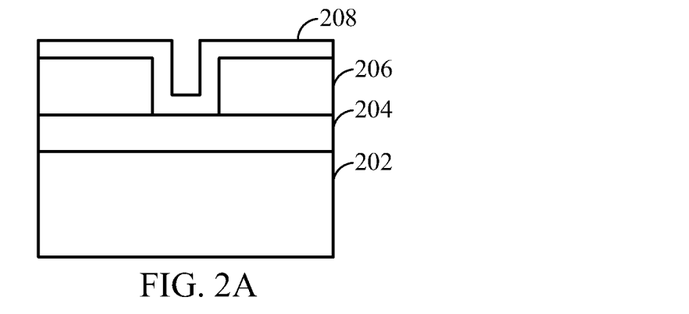
FIG. 2A-2J are cross-sectional views of a layer structure for manufacturing microbumps according to one embodiment.
Figure 2B:
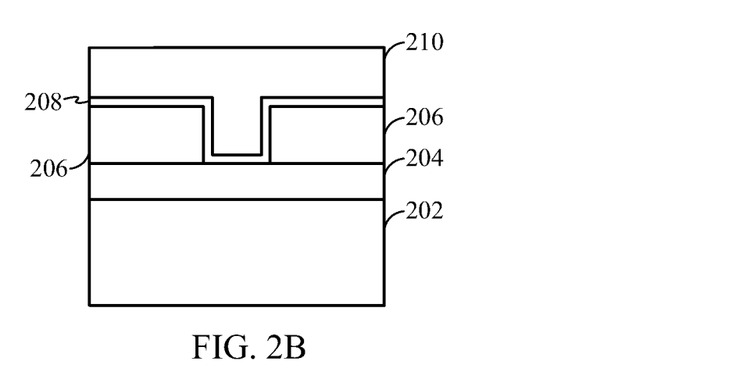
Figure 2C:
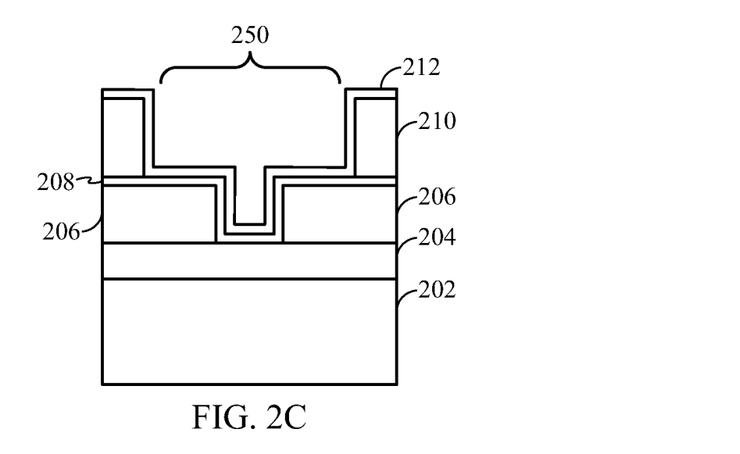
Figure 2D:
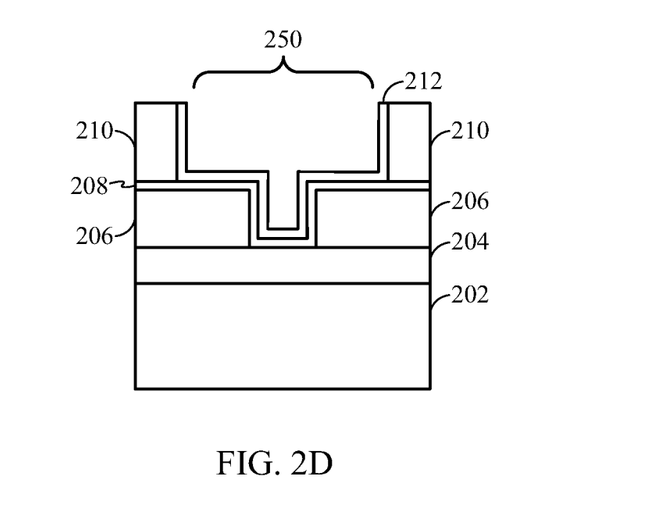
Figure 2E:
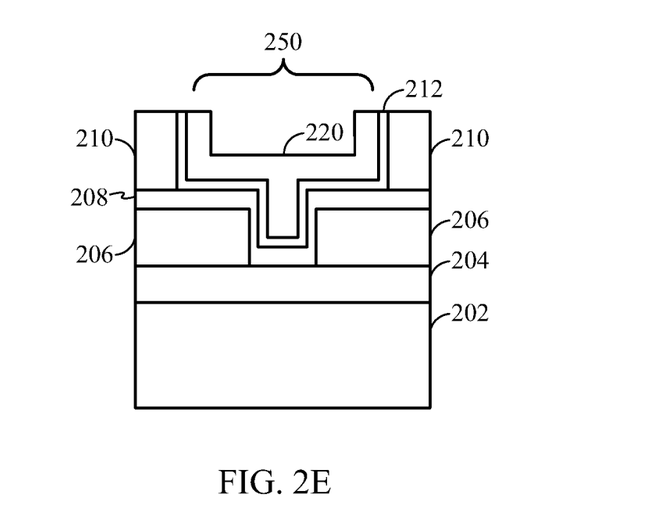
Figure 2F:
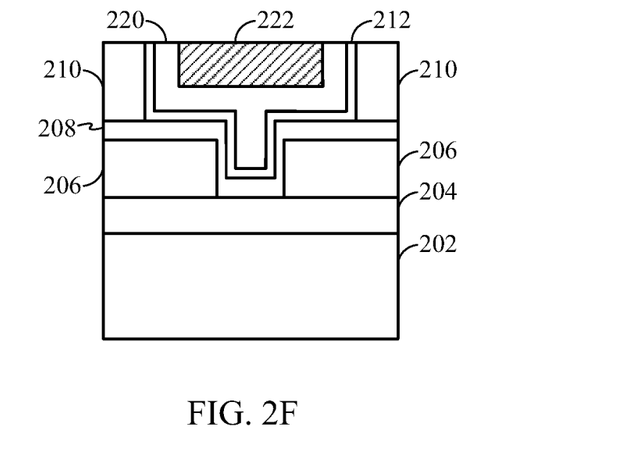
Figure 2G:
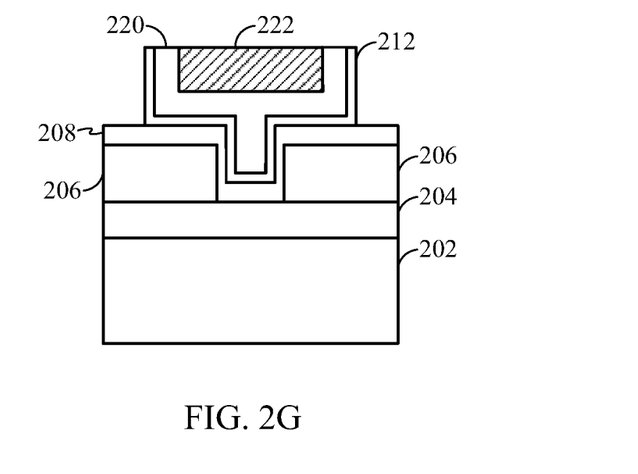
Figure 2H:
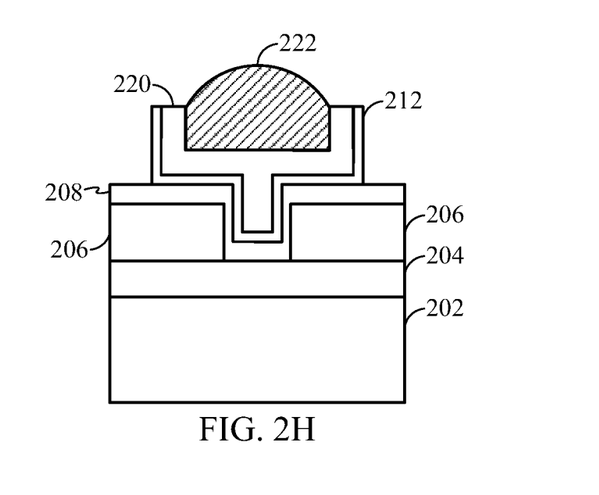
Figure 2I:
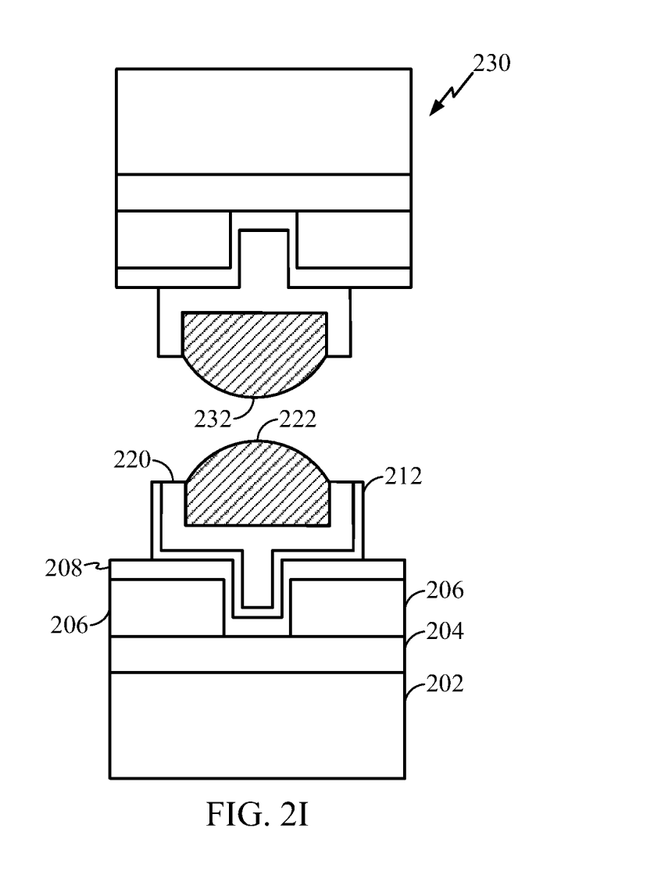
Figure 2J:
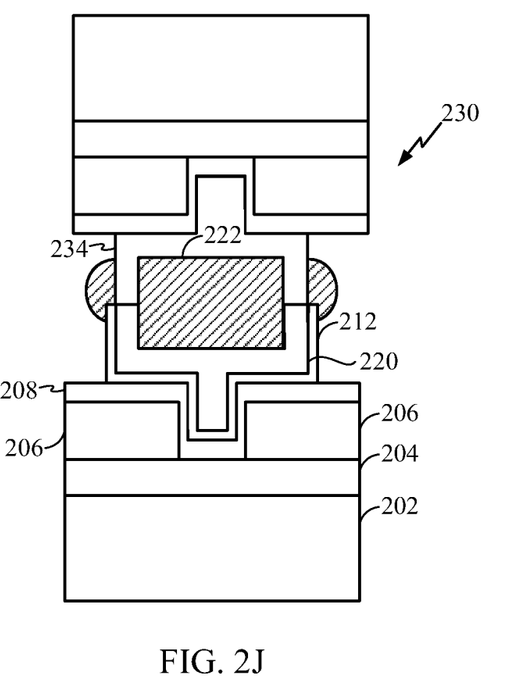
Figure 3:
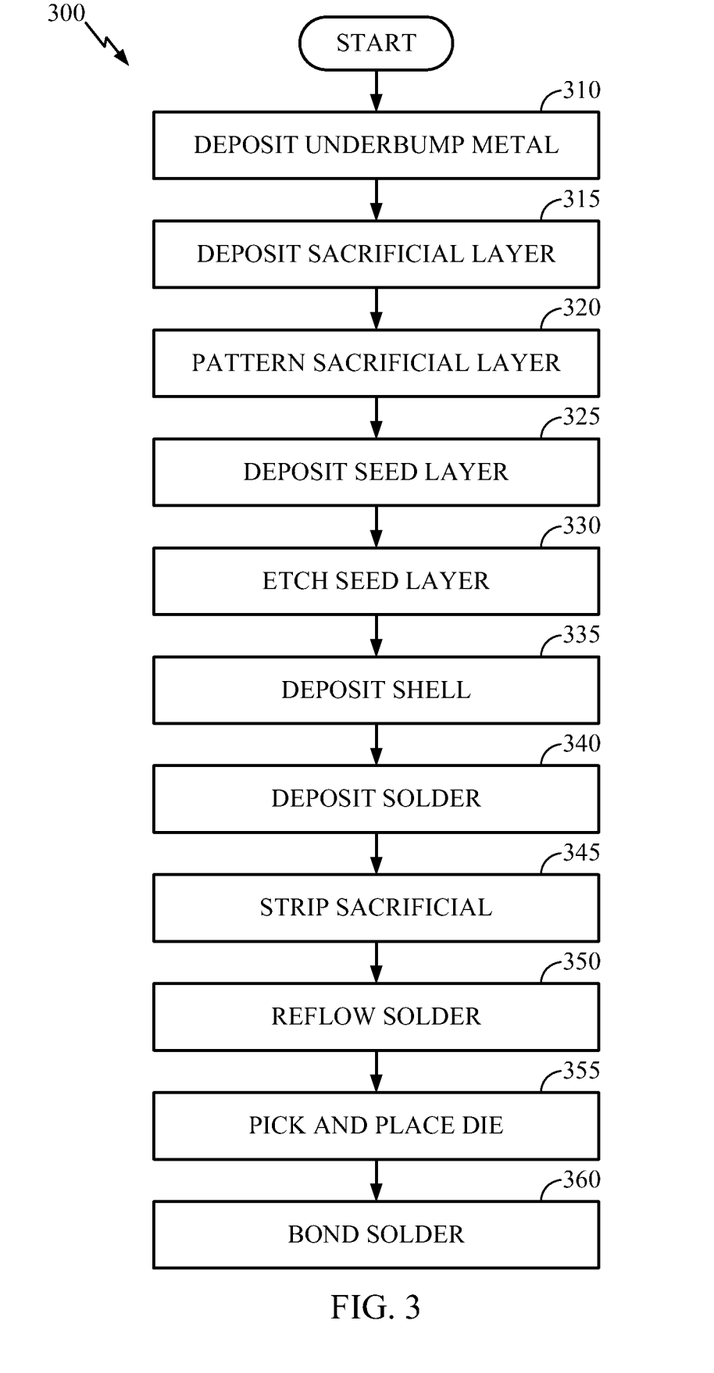
FIG. 3 is a flow chart illustrating an exemplary process for manufacturing microbumps according to one embodiment.

FIGS. 2A-2J are cross-sectional views of a layer structure for manufacturing microbumps according to one embodiment. A flow chart illustrating an exemplary process for manufacturing microbumps according to one embodiment is shown in FIG. 3 and will be presented with FIGS. 2A-2J. A flow chart 300 begins at block 310 with depositing an underbump metal (UBM) layer. FIG. 2A is a cross-sectional view illustrating an exemplary layer structure after depositing a UBM according to one embodiment. A substrate 202 includes back-end-of-line (BEOL) layers 204. The substrate 202 may be a semiconductor material or an organic material. A passivation layer 206 is deposited on the BEOL layers 204 followed by a UBM layer 208. An opening in the passivation layer 206 may correspond to a contact pad for coupling the BEOL layers 204 to a microbump. According to one embodiment, the UBM layer 208 is conformally deposited over the passivation layer 206 and the BEOL layers 204.

At block 315 a sacrificial layer is deposited on the UBM layer. FIG. 2B is a cross-sectional view illustrating an exemplary layer structure after deposition of a sacrificial layer according to one embodiment. A sacrificial layer 210 is deposited on the UBM layer 208. The sacrificial layer 210 may be a photoresist layer.

At block 320 the sacrificial layer is patterned and at block 325 a seed layer is deposited. FIG. 2C is a cross-sectional view illustrating an exemplary layer structure after patterning of the sacrificial layer and depositing a seed layer according to one embodiment. An opening 250 is patterned in the sacrificial layer 210. According to one embodiment, the opening 250 corresponds with a contact pad in the BEOL layers 204 and an opening in the passivation layer 206. A seed layer 212 is deposited on the sacrificial layer 210 and the UBM layer 208. According to one embodiment, the seed layer 212 is a titanium and copper bilayer deposited through physical vapor deposition (PVD).

At block 330 the seed layer is etched from the sacrificial layer. FIG. 2D is a cross-sectional view illustrating an exemplary layer structure after patterning of the seed layer according to one embodiment. The seed layer 212 is removed from the top of the sacrificial layer 210. According to one embodiment, a reactive ion etch (RIE) patterns the seed layer 212. During RIE, ions bombard the surface of the seed layer 212 and have a trajectory normal to the surface of the top surface of the seed layer 212. During RIE etching, the seed layer 212 may be removed from the top of the sacrificial layer 210 while remaining on sidewalls of the opening 250.

At block 335 a shell is deposited in the opening 250. FIG. 2E is a cross-sectional view illustrating an exemplary layer structure after depositing a copper shell according to one embodiment. A conductive shell 220 is deposited in the opening 250. According to one embodiment, the shell 220 is electrodeposited by immersing the seed layer 212 in a copper electrolyte while applying a voltage to the seed layer 212. According to another embodiment, the shell 220 is nickel deposited by electroplating. The electrodeposition may be conformal resulting in a shape of the conductive shell 220 correlating with the opening 250. According to one embodiment, the copper electrolyte may include additives such as accelerators, directional controls, and inhibitors to achieve suitable conformality of the opening 250.

At block 340 solder is deposited in the shell. FIG. 2F is a cross-sectional view illustrating an exemplary layer structure after depositing solder according to one embodiment. A solder 222 is deposited in the shell 220. According to one embodiment, the solder 222 is a tin-silver alloy electroplated in the shell 220.

At block 345 the sacrificial layer is stripped. FIG. 2G is a cross-sectional view illustrating an exemplary layer structure after stripping the sacrificial layer according to one embodiment. The sacrificial layer 210 is removed. According to one embodiment, the sacrificial layer 210 is removed through a wet chemical etch.

At block 350 the solder is reflowed. FIG. 2H is a cross-sectional view illustrating an exemplary layer structure after solder reflow according to one embodiment. The solder 222 is reflowed by applying a high temperature to the solder 222 during which the solder 222 forms a ball or rounded surface. According to one embodiment, the shell 220 has a melting temperature higher than the solder 222 such that the shell 220 does not reflow during reflow of the solder 222.

At block 355 the substrate 202, which may be a die, is picked and placed to align with a second die. FIG. 2I is a cross-sectional view illustrating two exemplary substrates after pick and place according to one embodiment. A second substrate 230 having solder 232 is aligned to the solder 222 of the substrate 202. According to one embodiment, the substrate 230 has a symmetric structure around the solder 232 corresponding to the structure around the solder 222 on the substrate 202. According to another embodiment, the solder 232 on the substrate 230 may have an asymmetric shape to the solder 222 on the substrate 202.

At block 360 solder is bonded between two substrates, such as a first die to a second die or a die to a packaging substrate. FIG. 2J is a cross-sectional view illustrating two exemplary bonded substrates according to one embodiment. The solder 222 and the solder 232 are bonded together. According to one embodiment, thermo compression bonding is performed to make contact between the conductive shell 220 of the substrate 202 and a conductive shell 234 of the substrate 230. During compression bonding, some solder beading may occur as the solder 222 beads outside the conductive shell 220 and the conductive shell 234. According to one embodiment, the conductive shell 234 is 1-5 micrometers in thickness, and the solder 232 is 5-20 micrometers in diameter.

According to another embodiment, the shell of the microbump may be deposited through electrodeposition techniques such as, for example, electroless deposition. FIGS. 4A-4F are cross-sectional views illustrating an exemplary layer structure for a microbump according to one embodiment. FIG. 5 is a flow chart illustrating an exemplary method for forming the microbump with shell according to this embodiment.

Figure 4A:
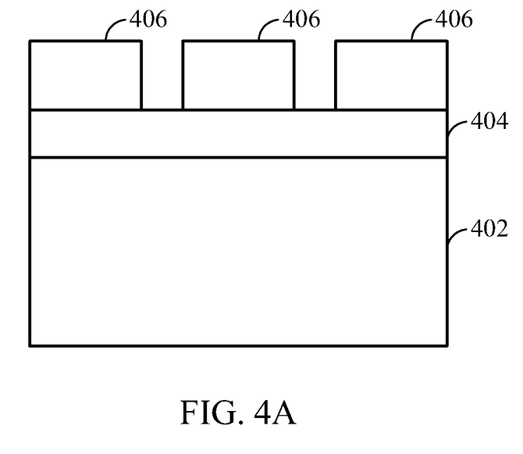
FIGS. 4A-4F are cross-sectional views illustrating an exemplary layer structure for a microbump according to one embodiment.
Figure 5:
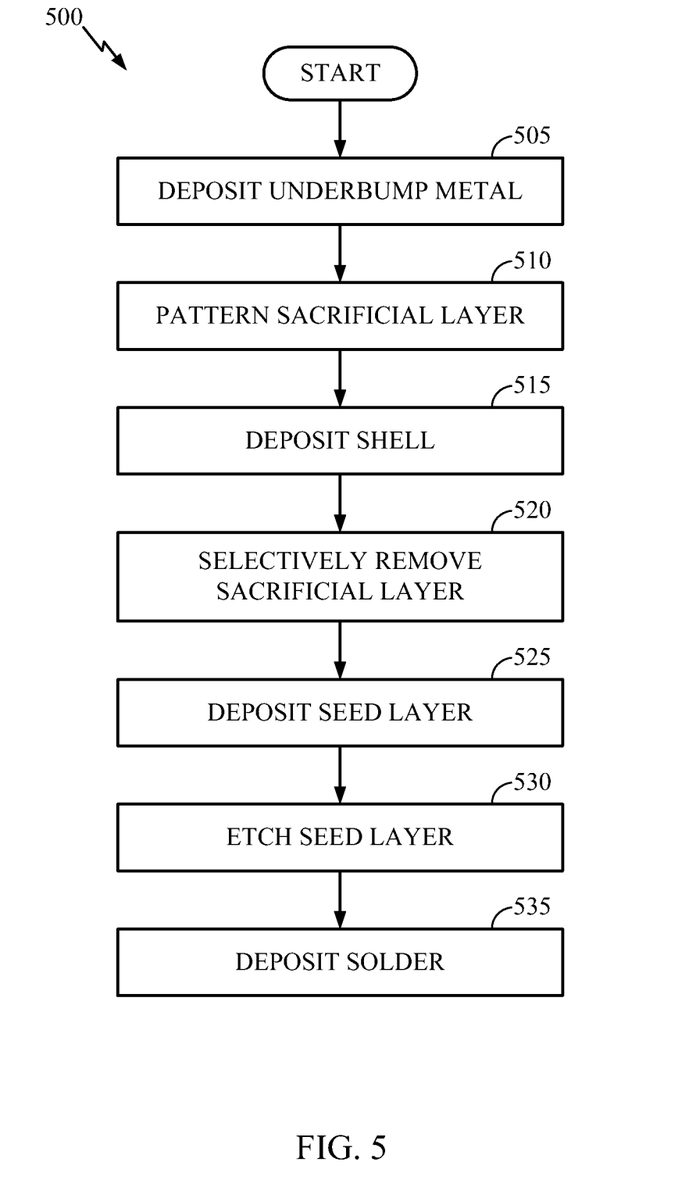
FIG. 5 is a flow chart illustrating an exemplary method for forming the microbump with shell according to one embodiment.

A flow chart 500 begins at block 505 with depositing an underbump metal (not shown in FIG. 4A). The flow chart continues to block 510 with patterning a sacrificial layer. FIG. 4A is a cross-sectional view illustrating an exemplary layer structure after patterning a sacrificial layer according to one embodiment. A sacrificial layer 406 is deposited on a BEOL layer 404 on a substrate 402. The sacrificial layer 406 is patterned with annulus shapes to form a shell of a microbump. According to one embodiment, the sacrificial layer 406 is a photoresist layer and patterning is accomplished by exposing the photoresist through a mask and developing the photoresist.

Figure 4B:
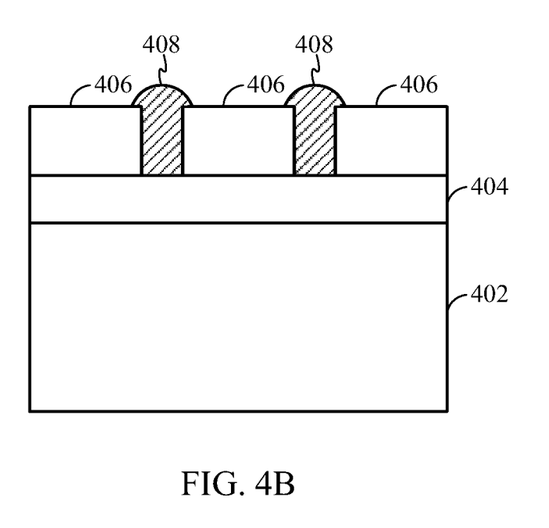

At block 515 a shell is deposited in the patterned openings of the sacrificial layer. FIG. 4B is a cross-sectional view illustrating an exemplary layer structure after depositing a microbump shell according to one embodiment. A shell 408 is deposited to form an annular ring in the sacrificial layer 406.

According to one embodiment, the shell 408 is deposited through electroless deposition of copper.

Figure 4C:
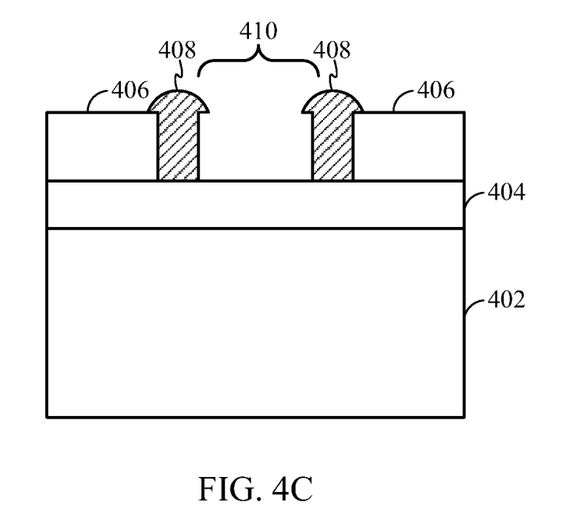

At block 520 the sacrificial layer is selectively removed to expose the inner region of the annulus formed in the sacrificial layer. FIG. 4C is a cross-sectional view illustrating an exemplary layer structure after selective removal of the sacrificial layer according to one embodiment. An opening 410 is formed inside the shell 408 by selectively removing the sacrificial layer 406.

Figure 4D:
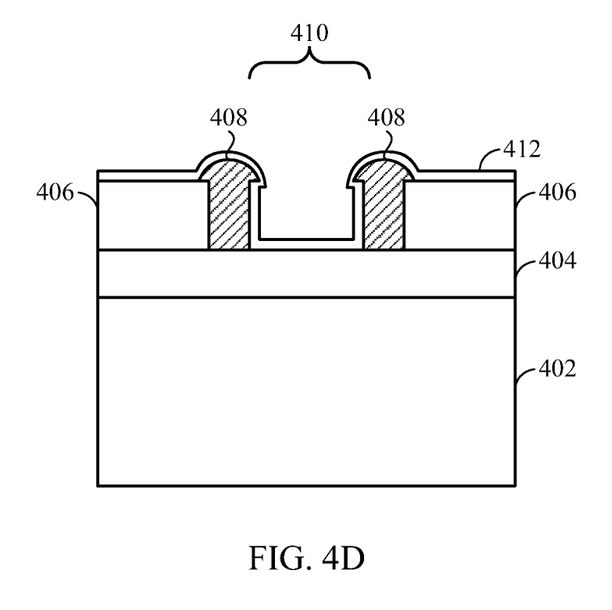

At block 525 a seed layer is deposited. FIG. 4D is a cross-sectional view illustrating an exemplary layer structure after seed layer deposition according to one embodiment. A seed layer 412 is deposited on the sacrificial layer 406, the shell 408, and the BEOL layer 404. According to one embodiment the seed layer 412 is a Ti/Cu bilayer deposited through PVD.

Figure 4E:
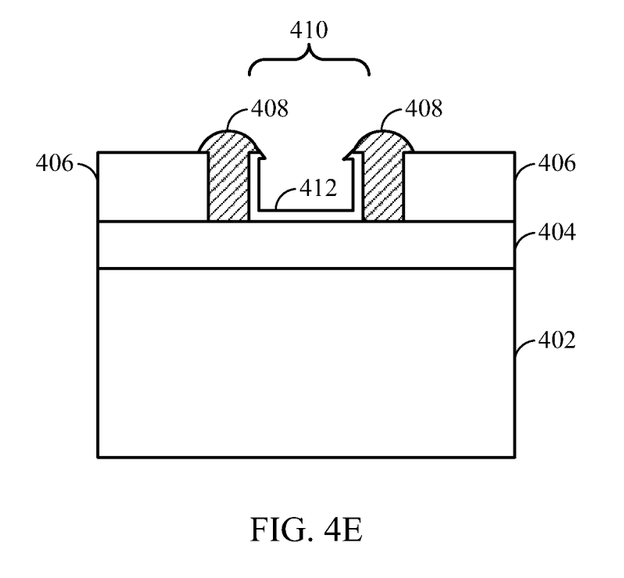

At block 530 the seed layer is etched. FIG. 4E is a cross-sectional view illustrating an exemplary layer structure after seed layer etching according to one embodiment. The seed layer 412 is etched to remove the seed layer 412 from regions outside the opening 410. According to one embodiment, RIE is performed to remove the seed layer 412.

Figure 4F:
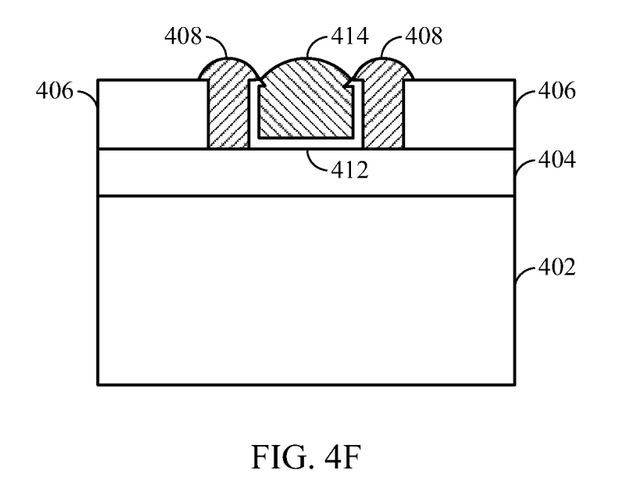

At block 535 solder is deposited in the shell. FIG. 4F is a cross-sectional view illustrating an exemplary layer structure after deposition of solder according to one embodiment. A solder 414 is deposited in the opening 410. According to one embodiment, the solder 414 is electrodeposited in the opening 410 using the seed layer 412 as an electrode. The solder 414 may be, for example, a tin-silver alloy.

Copper sidewalls placed around solder microbump joints reduce the effects of electromigration and reduce occurrences of bridging and shorting between microbumps. Thus, microbumps may be constructed with smaller diameters and smaller pitches allowing increased connection densities between two dies or between a die and a substrate.

Figure 6:
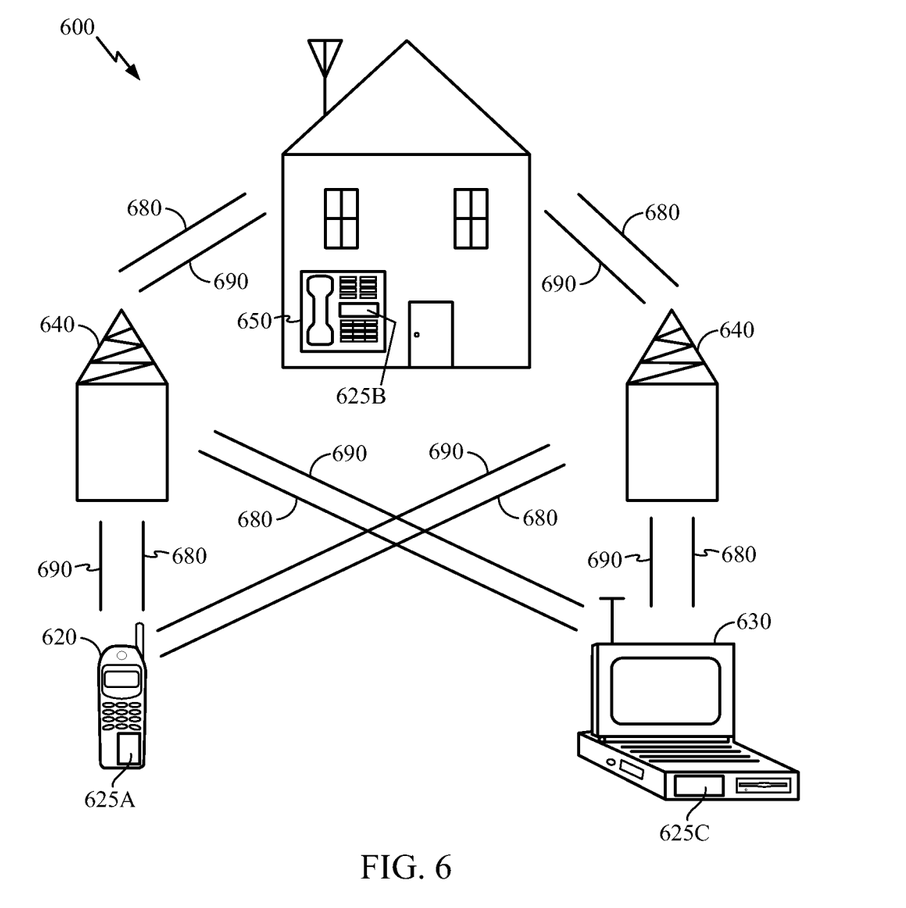
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, that include the disclosed microbump structure. It will be recognized that any device containing an IC may also include the microbump structure disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes packaged integrated circuits having microbumps.

Figure 7:
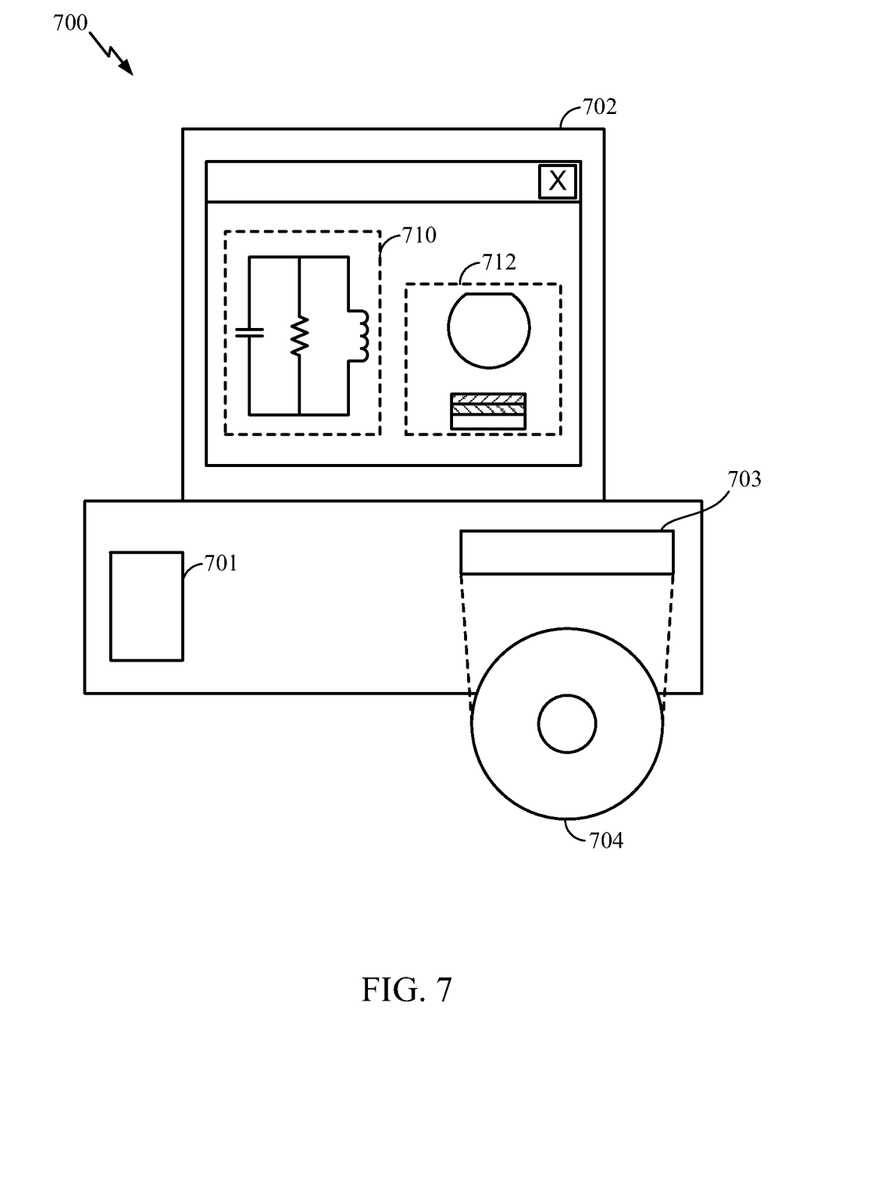
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as a microbump as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit having microbumps. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
   a first substrate coupled to a second substrate; and
   a packaging connection coupling the first substrate to the second substrate, the packaging connection comprising a shell of first conductive material enclosing a second conductive material, in which the first conductive material has a higher melting point than the second conductive material.

2. The apparatus of claim 1, in which the first conductive material is copper and the second conductive material is solder.

3. The apparatus of claim 1, in which the first substrate is at least one of a semiconductor material and a organic material.

4. The apparatus of claim 1, in which the packaging connection is integrated into at least one of a mobile phone, a set top box, a music player, a video player, an entertainment unit, a navigation device, a computer, a hand-held personal communication systems (PCS) unit, a portable data unit, and a fixed location data unit.

5. An apparatus, comprising:
   an outer shell connecting means for reducing electromigration, the outer shell connecting means in communication with a first substrate and connecting with an outer shell connecting means of a second substrate; and
   a solder connecting means of the first substrate, the solder connecting means of the first substrate connecting with a solder connecting means of the second substrate, the solder connecting means of the first substrate residing within the outer shell connecting means of the first substrate.

6. The apparatus of claim 5, in which the first substrate is integrated into at least one of a mobile phone, a set top box, a music player, a video player, an entertainment unit, a navigation device, a computer, a hand-held personal communication systems (PCS) unit, a portable data unit, and a fixed location data unit.

* * * * *